US008148215B2

(12) United States Patent
Kato et al.

(10) Patent No.: US 8,148,215 B2
(45) Date of Patent: *Apr. 3, 2012

(54) NON-VOLATILE MEMORY AND METHOD OF MANUFACTURING THE SAME

(75) Inventors: Kiyoshi Kato, Kanagawa (JP); Yoshiyuki Kurokawa, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 157 days.

This patent is subject to a terminal disclaimer.

(21) Appl. No.: 12/484,273

(22) Filed: Jun. 15, 2009

(65) Prior Publication Data
US 2009/0269911 A1 Oct. 29, 2009

Related U.S. Application Data

(60) Continuation of application No. 11/206,151, filed on Aug. 18, 2005, now Pat. No. 7,550,334, and a division of application No. 10/128,341, filed on Apr. 24, 2002, now abandoned.

(30) Foreign Application Priority Data

Apr. 24, 2001 (JP) ................................. 2001-126660

(51) Int. Cl.
*H01L 21/84* (2006.01)
(52) U.S. Cl. ................. 438/151; 438/257; 257/E21.179
(58) Field of Classification Search .......... 438/257–267; 257/E21.179
See application file for complete search history.

(56) References Cited

U.S. PATENT DOCUMENTS
3,890,632 A 6/1975 Ham et al.
(Continued)

FOREIGN PATENT DOCUMENTS
JP 04-299864 10/1992
(Continued)

OTHER PUBLICATIONS

S. Isomae et al., "Cross Sectional TEM Observation of VLSI Devices and Thermal Oxide Morphology", Extended Abstracts of the 18th (1986 International) Conference on Solid State Devices and Materials, Aug. 20-22, 1986, pp. 517-520.

(Continued)

*Primary Examiner* — Richard A. Booth
(74) *Attorney, Agent, or Firm* — Nixon Peabody LLP; Jeffrey L. Costellia

(57) ABSTRACT

A non-volatile memory in which a leak current from an electric charge accumulating layer to an active layer is reduced and a method of manufacturing the non-volatile memory are provided. In a non-volatile memory made from a semiconductor thin film that is formed on a substrate (101) having an insulating surface, active layer side ends (110) are tapered. This makes the thickness of a first insulating film (106), which is formed by a thermal oxidization process, at the active layer side ends (110) the same as the thickness of the rest of the first insulating film. Therefore local thinning of the first insulating film does not take place. Moreover, the tapered active layer side ends hardly tolerate electric field concentration at active layer side end corners (111). Accordingly, a leak current from an electric charge accumulating layer (107) to the active layer (105) is reduced to improve the electric charge holding characteristic. As a result, the first insulating film can be further made thin to obtain a high performance non-volatile memory that operates at a low voltage and consumes less power.

15 Claims, 9 Drawing Sheets

U.S. PATENT DOCUMENTS

| | | | |
|---|---|---|---|
| 4,334,347 | A | 6/1982 | Goldsmith et al. |
| 5,381,029 | A | 1/1995 | Eguchi et al. |
| 5,446,301 | A | 8/1995 | Eguchi et al. |
| 5,470,762 | A | 11/1995 | Codama et al. |
| 5,478,766 | A * | 12/1995 | Park et al. .................... 438/158 |
| 5,643,826 | A | 7/1997 | Ohtani et al. |
| 5,728,259 | A | 3/1998 | Suzawa et al. |
| 5,757,030 | A | 5/1998 | Codama et al. |
| 5,840,600 | A | 11/1998 | Yamazaki et al. |
| 5,888,858 | A | 3/1999 | Yamazaki et al. |
| 5,923,962 | A | 7/1999 | Ohtani et al. |
| 6,005,270 | A | 12/1999 | Noguchi |
| 6,097,051 | A | 8/2000 | Torii et al. |
| 6,124,153 | A | 9/2000 | Lee et al. |
| 6,180,439 | B1 | 1/2001 | Yamazaki et al. |
| 6,335,716 | B1 | 1/2002 | Yamazaki et al. |
| 6,509,217 | B1 | 1/2003 | Reddy |
| 6,573,533 | B1 | 6/2003 | Yamazaki |
| 6,774,440 | B1 | 8/2004 | Shibata et al. |
| 6,787,403 | B2 | 9/2004 | Inoue et al. |
| 6,808,963 | B2 | 10/2004 | Ishida et al. |
| 6,940,138 | B2 | 9/2005 | Yamazaki |
| 2002/0171085 | A1 | 11/2002 | Suzawa et al. |

FOREIGN PATENT DOCUMENTS

| | | |
|---|---|---|
| JP | 04-363028 | 12/1992 |
| JP | 07-130652 A | 5/1995 |
| JP | 07-130668 | 5/1995 |
| JP | 08-153699 | 6/1996 |
| JP | 08-181231 A | 7/1996 |
| JP | 10-335653 | 12/1998 |
| JP | 11-087545 | 3/1999 |
| JP | 11-143379 A | 5/1999 |
| JP | 11-204801 | 7/1999 |
| JP | 2000-031493 | 1/2000 |
| JP | 2001-094114 | 4/2001 |

OTHER PUBLICATIONS

R.B. Marcus et al., "The Oxidation of Shaped Silicon Surfaces", Journal of the Electrochemical Society, vol. 129, No. 6, Jun. 1982, pp. 1278-1282.

Seiichi Isomae et al., "Cross Sectional TEM Observation of VLSI Devices and Thermal Oxide Morphology", Extended Abstracts of the $18^{th}$ (1986 International) Conference on Solid State Devices and Materials, Aug. 20, 1986, pp. 517-520.

Isomae.S et al., "Cross Sectional TEM Observation of VLSI Devices and Thermal Oxide Morphology,", Extended Abstracts of the 18th (1986 International) Conference on Solid State Devices and Materials, Aug. 20, 1986, pp. 517-520.

* cited by examiner

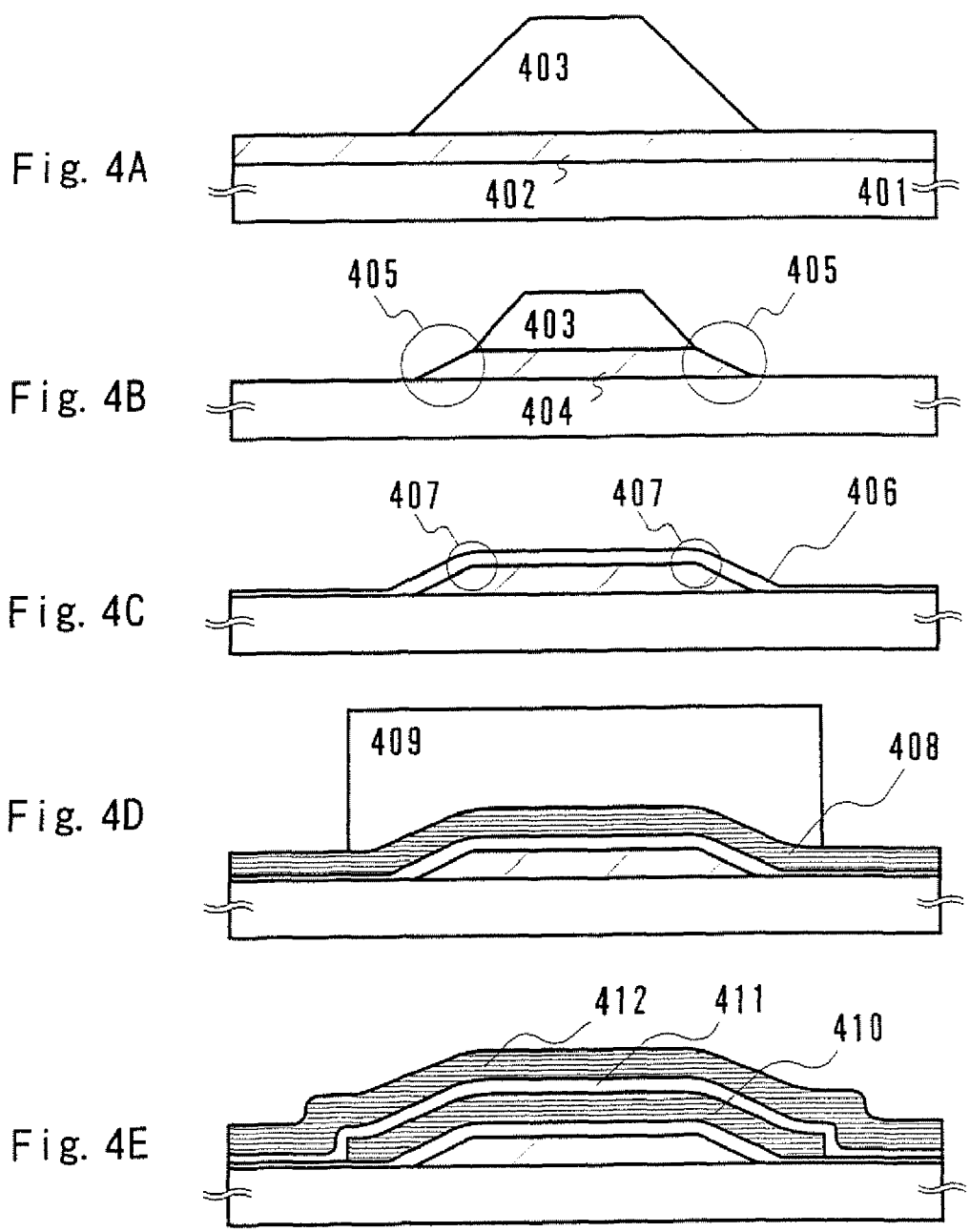

NON-VOLATILE MEMORY AND METHOD OF MANUFACTURING THE SAME

BACKGROUND OF THE INVENTION

1. Field of the Invention

The present invention relates to a non-volatile memory using a thin film transistor (TFT) and to a method of manufacturing the non-volatile memory.

2. Description of Related Art

The technique for forming a semiconductor thin film on an insulating substrate, especially the one for forming a silicon thin film on a glass substrate, is advancing at a remarkable pace in recent years. Conventionally, an insulated gate field effect transistor such as a MOS FET is formed on a single crystal semiconductor substrate. A TFT that has as its active layer a semiconductor thin film formed on an insulating substrate is expected to have low parasitic capacitance, high operation-speed, less power consumption, and a low manufacturing cost. Great hopes are laid on a system-on-glass in which those characteristics of TFT are utilized to integrate a system LSI on a glass substrate. To realize the system-on-glass, it is indispensable to build a non-volatile memory from a semiconductor thin film.

A non-volatile memory formed on a single crystal semiconductor substrate is typically one composed of a non-volatile memory element (hereinafter referred to as memory MOS FET in which an electric charge accumulating layer (hereinafter referred to as floating gate) isolated electrically is formed in the active layer-gate of the MOS FET. In the memory MOS FET, the threshold changes in accordance with the amount of electric charges held in the floating gate and, therefore, one memory state is distinguished from another memory state depending on the magnitude of the threshold. Electric charges are injected to the floating gate electrically by a tunnel current or hot electrons. Electric charges are withdrawn from the floating gate by a tunnel current electrically, or by ultraviolet irradiation.

The expression "active layer-gate" means a region between an active layer and a gate. In this specification, the name of one component of a device, such as an active layer or a gate, is hyphenated to the name of another component to refer to a region between the former component and the latter component.

In the memory MOS FET, injection and withdrawal of electric charges by a tunnel current take place in a part of a first insulating film (hereinafter referred to as tunnel oxide film) in the active layer-floating gate, or throughout the first insulating film. Therefore, for the sake of low voltage operation and quick rewriting, the tunnel oxide film has to be thin. On the other hand, for the sake of electric charge holding, the tunnel oxide film has to be thick in order to reduce the leak current. Thus the tunnel oxide film of the memory MOS FET is required to have conflicting properties and very quality insulating film is needed for the tunnel oxide film.

The insulating film can be formed by deposition using CVD apparatus, or by thermal oxidation or other methods. Thermal oxidation can provide a good quality insulating film that has only few defects in the active layer-thermal oxide film interface in addition to other merits. Accordingly, a thermal oxide film is desirably used as the tunnel oxide film.

However, in a normal TFT manufacturing process, an active layer formed by a semiconductor thin film etching process drops off sharply along the sides like a cliff. When the active layer having the cliff-like side ends is thermally oxidized. the resultant oxide film is locally thin at the side ends and causes stress concentration as has been commonly known.

The side ends are the left and right faces to the face the active layer that is in contact with the substrate. In other words, the side ends are side faces with respect to the face of the active layer that is in contact with the substrate. The side ends, i.e., the side faces, are not limited to flat faces but may be curved faces in this specification. Also, the side faces may be faceted to have a multitude of faces.

The above problems are illustrated in FIGS. 2A and 2B. FIG. 2A shows the section of the active layer after formation. Reference symbol 201 denotes a substrate having an insulating surface, 202, the active layer, 203, active layer side ends, and 204, corners of the active layer side ends 203 (hereinafter referred to as active layer side end corners). FIG. 2B shows the section of the active layer after formation of a thermal oxide film, which is denoted by 205. The active layer side end corners 204 become pointed during the thermal oxidization step to make the thermal oxide film 205 locally thin.

These problems of locally-thinned oxide film and stress concentration are explained by a simulation using a viscoelasticity model of silicon dioxide. Detailed descriptions can be found on this matter in, for example, a document written by S. Isomae and S. Aoki for ICSSDM Dig. Tech. Papers, 1986 (p. 517) and a document written by R. B. Marcus and T. T. Sheng for Journal of the Electrochemical Society vol. 129, 1982 (pp. 1278-1282).

As described above, the insulating characteristic of a tunnel oxide film is seriously impaired at active layer side ends when a memory TFT is fabricated through the active layer formation process and the thermal oxidization process for obtaining a quality tunnel oxide film in a normal TFT manufacturing process. The term memory TFT refers to a non-volatile memory element in which an electrically isolated floating gate is formed in the active layer-gate of the TFT.

With the semiconductor active layer side end corners pointed, another problem is raised, in which the electric field created by electric charges that are accumulated in the floating gate concentrates around the active layer side end corners even when no voltage is applied to a control gate.

These problems mean an increase in leak current flowing from the floating gate through the active layer side end corners to the active layer in the memory TFT, leading to degradation in electric charge holding characteristic. These problems caused by thermal oxidization of the active layer side ends similarly occur in the case where formation of the oxide film by CVD apparatus or the like precedes thermal oxidization.

SUMMARY OF THE INVENTION

The present invention has been made in view of the above problems, and an object of the present invention is therefore to provide a non-volatile memory in which a leak current from a floating gate to an active layer is reduced to obtain high electric charge holding ability and a method of manufacturing the non-volatile memory.

According to the present invention, there is provided a non-volatile memory with a plurality of memory transistors, each of the memory transistors comprising:

a semiconductor having first and second electrodes and a channel region;

a first insulating film that is in contact with the semiconductor;

a first gate that is in contact with the first insulating film;

a second insulating film that is in contact with the first gate; and a second gate that is in contact with the second insulating film, characterized in that, of side ends of the semiconductor, at least a region that overlaps with the first insulating film and with the first gate is tapered.

According to the present invention, there is provided a method of manufacturing a non-volatile memory, characterized by comprising:

forming a semiconductor;

forming a tapered resist on the semiconductor;

using the resist as a mask for anisotropic etching of the semiconductor to taper side ends of the semiconductor;

forming a first insulating film on the semiconductor with its side ends tapered;

forming a first gate that is in contact with the first insulating film;

forming a second insulating film that is in contact with the first gate; and forming a second gate that is in contact with the second insulating film.

The present invention having the above structures is capable of avoiding thinning of a tunnel oxide film as well as electric field concentration at semiconductor side end corners. Therefore the present invention can provide a non-volatile memory in which a leak current from a floating gate to an active layer is reduced and a manufacturing method thereof. The invention can also provide a non-volatile memory with an enhanced electric charge holding characteristic and a manufacturing method thereof. Furthermore, the present invention can provide a non-volatile memory in which an insulating film is made more thin while keeping the electric charge holding characteristic to achieve lower voltage operation, quicker rewriting, and less power consumption, and a manufacturing method thereof.

BRIEF DESCRIPTION OF THE DRAWINGS

In the accompanying drawings:

FIGS. 4A to 4E are sectional views showing major steps in manufacturing an n type memory TFT of Embodiment 1;

DETAILED DESCRIPTION OF THE PREFERRED EMBODIMENTS

Embodiment Mode

This embodiment mode describes a typical element structure for a memory TFT of the present invention.

Figure 1A:
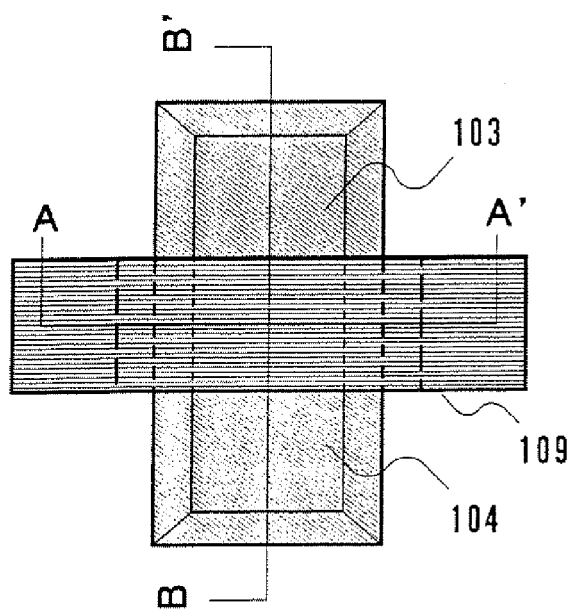
FIG. 1A is a plan view showing an n type memory TFT according to an embodiment mode of the present invention.
Figure 1C:
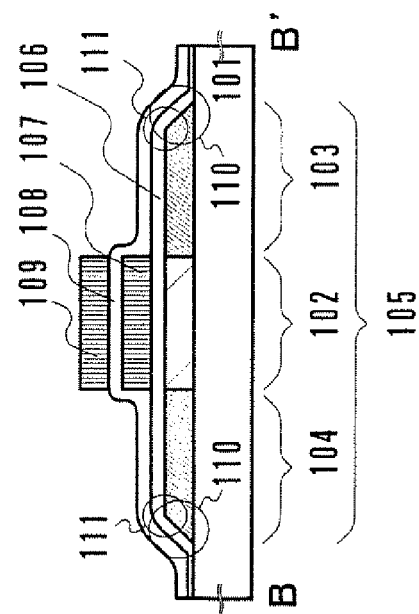
FIG. 1C is a sectional view taken along the line B-B' in FIG. 1A.
Figure 1B:
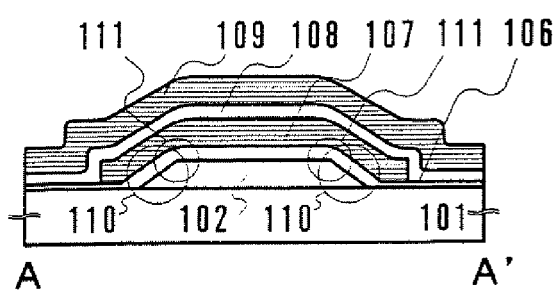
FIG. 1B is a sectional view taken along the line A-A' in FIG. 1A.
Figure 1D:
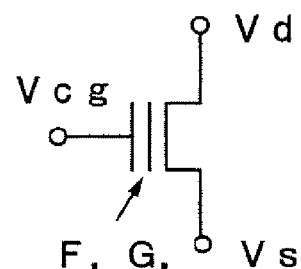
FIG. 1D is a circuit diagram.
Figure 2A:
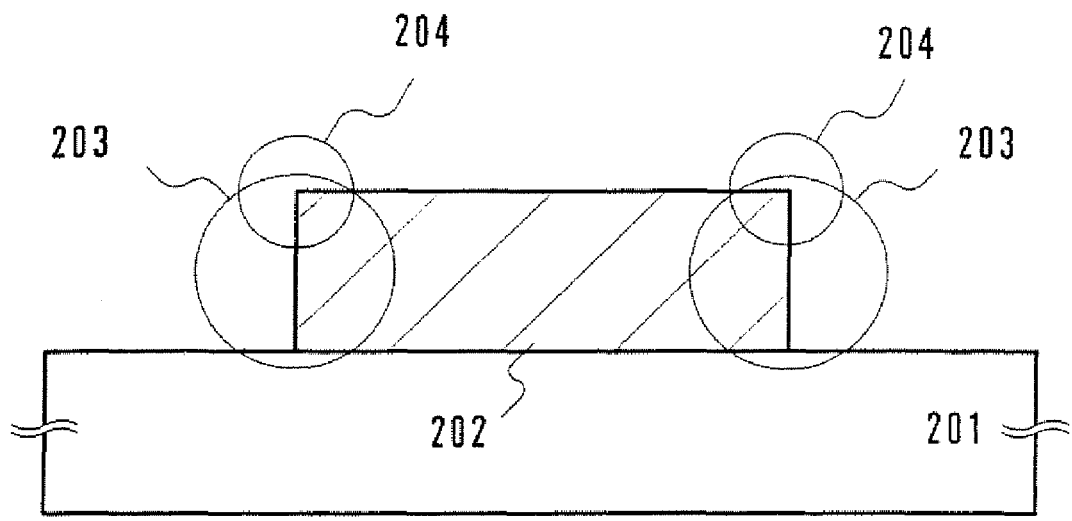
FIG. 2A is a sectional view of an active layer in the middle of its formation in a conventional TFT manufacturing process.
Figure 2B:
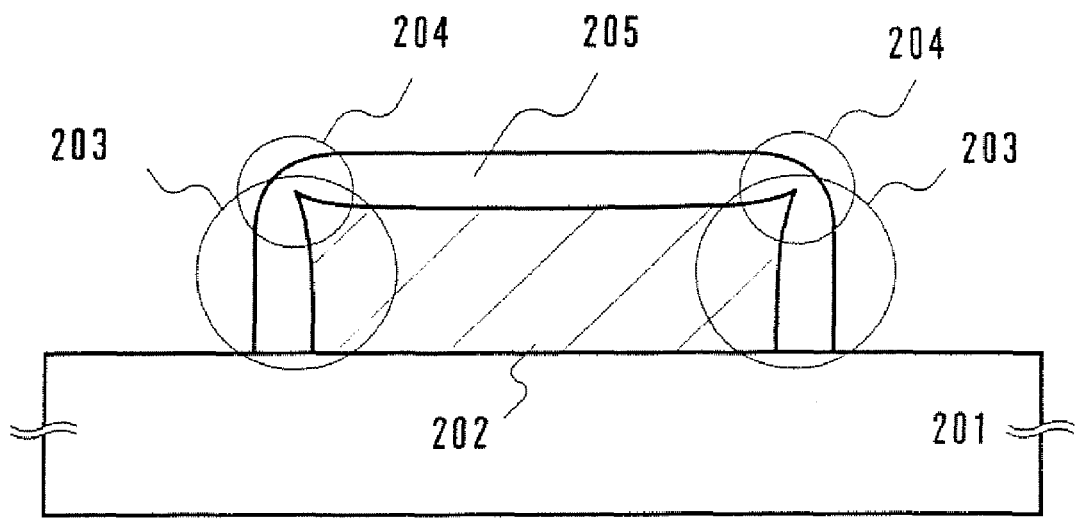
FIG. 2B is sectional view of the active layer during formation of a thermal oxide film.

FIG. 1A is a plan view of an n type memory TFT having a stacked structure according to the embodiment mode of the present invention. FIG. 1B is a sectional view taken along the line A-A' in FIG. 1A. FIG. 1C is a sectional view taken along the line B-B' in FIG. 1A. FIG. 1D is a circuit diagram.

In FIGS. 1A, 1B, and 1C, a channel forming region 102, a source region 103. and a drain region 104 are formed on a substrate 101 having an insulating surface from a semiconductor thin film. The channel forming region 102, the source region 103, and the drain region 104 together make an active layer 105. The source region 103 and the drain region 104 are n type impurity regions and are formed by doping the semiconductor thin film with arsenic (or phosphorus).

A first insulating film (tunnel oxide film) 106 is laid on the active layer. On the tunnel oxide film 106, an electric charge accumulating layer (floating gate) 107 is formed. A second insulating film 108 is laid on the floating gate 107. A control gate 109 is formed on the second insulating film 108.

This embodiment mode is characterized in that active layer side ends 110 are tapered. In the active layer formed by a semiconductor thin film etching process, corners that faces formed by the etching and the bottom face of the active layer make are called taper corners, and the angle of the taper corners is referred to as taper angle.

In this embodiment mode, the taper angle is desirably 20 to 70° (more desirably 30 to 60°). This makes the thickness of the tunnel oxide film 106 at the active layer side end corners 111 the same as the thickness of the rest of the tunnel oxide film. Moreover, electric field concentration at the active layer side end corners 111 is reduced. Accordingly, a leak current from floating gate 107 to the active layer 105 while the voltage is applied to the control gate 109 and electric charges are accumulated in the floating gate 107 is reduced to improve the electric charge holding characteristic. As a result, the tunnel oxide film can be thinned and the TFT can operate at a low voltage consuming less power.

Figure 3A:
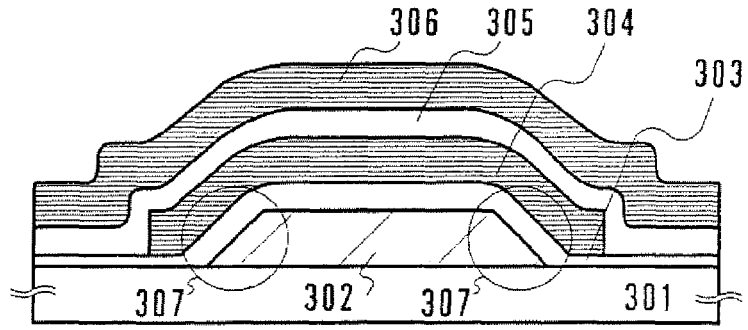
FIG. 3A is a sectional view of a memory TFT in which active layer side ends are tapered to have one tier.
Figure 3B:
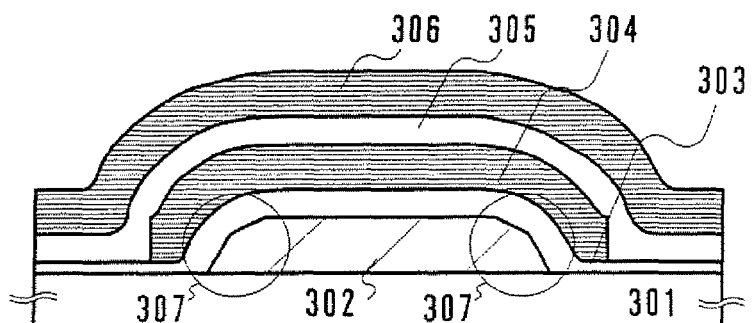
FIG. 3B is a sectional view of a memory TFT in which active layer side ends are tapered to have two tiers.
Figure 3C:
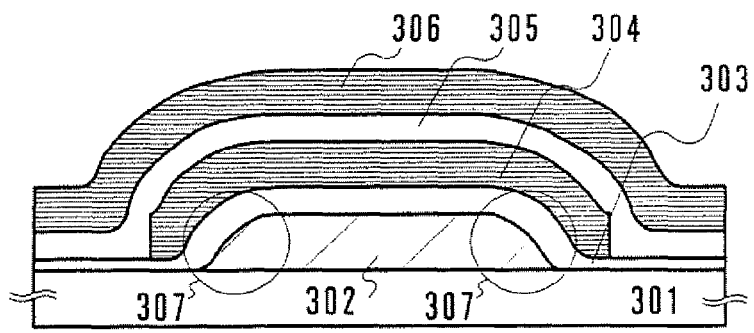
FIG. 3C is a sectional view of a memory TFT in which active layer side ends are tapered continuously.

In this embodiment mode, the active layer side ends 110 may be tapered to have one tier as shown in FIGS. 1B and 1C (this type reappears in FIG. 3A), or to have two tiers as shown in FIG. 3B. The number of tiers may be three or more. Alternatively, the active layer side ends 110 may be continuously tapered as shown in FIG. 3C. The sectional views are taken along the line A-A' in FIG. 1A. With the tapered active layer side ends having a multitude of tiers, or being continuously sloped, active layer side ends 307 at the interface between a substrate 301, which has an insulating surface, and the active layer can be prevented from becoming pointed.

In FIGS. 3A to 3C, 301 is the substrate having an insulating surface, 302 denotes a channel region, and 303 denotes a tunnel oxide film. Denoted by 304 is a floating gate, 305, a second insulating film, 306, a control gate, and 307, the active layer side ends.

The memory TFT in this embodiment mode is n type but may be p type instead. In the case of a p type memory TFT, the source region 103 and the drain region 104 are p type impurity regions formed by doping the semiconductor thin film with boron.

The example shown in this embodiment mode uses a semiconductor thin film formed on a substrate that has an insulating surface to form a memory TFT. However, the memory TFT may be formed on an SOI substrate.

In the present invention, it is sufficient if the active layer side ends are tapered at least in a region where the active layer overlaps the floating gate with the tunnel oxide film interposed therebetween. This is because the spirit of the present invention is in reduction of a leak current from the floating gate to the active layer in the active layer side ends.

An example of operation voltage of the n type memory TFT in the present invention is shown in Table 1. The operation voltage in Table 1 is merely an example and the operation voltage of the memory TFT is not limited to the values in Table 1.

TABLE 1

|  | Vcg | Vd | Vs | Mechanism |
|---|---|---|---|---|
| Write | 12 V | 8 V | 0 V | Injecting hot electron |
| Erase | −20 V | 0 V | 0 V | Erasing FN tunnel |
| Read | 5 V | 1 V | 0 V | — |

Having the above element structure, the present invention is capable of avoiding thinning of a tunnel oxide film as well as electric field concentration at semiconductor side end corners of the memory transistor. Therefore the present invention can reduce a leak current from a floating gate to an active layer, and can enhance the electric charge holding characteristic. Furthermore, the present invention can make an insulating film even thinner while keeping the electric charge holding characteristic to achieve lower voltage operation, quicker rewriting, and less power consumption.

Embodiment 1

This embodiment describes a method of manufacturing an n type memory TFT that has the structure shown in Embodiment Mode.

FIGS. 4A to 4E are sectional views each showing a major manufacturing step for manufacturing the n type memory TFT according to Embodiment Mode. These sectional views are taken along the line A-A' in FIG. 1A.

First, a polycrystalline silicon thin film 402 with a thickness of 500 angstrom is formed on a substrate 401 having an insulating surface as shown in FIG. 4A. A quartz substrate, a silicon substrate with a thermal oxide film formed thereon, a ceramic substrate with a base film formed thereon, or the like can be used as the substrate 401 having an insulating surface. In this embodiment, a quartz substrate is employed.

The polycrystalline silicon thin film 402 may be formed directly by CVD apparatus or may be obtained by crystallizing an amorphous silicon thin film. When crystallizing amorphous silicon, any of furnace annealing, laser annealing, and lamp annealing can be used. Also, a catalytic element that accelerates crystallization of silicon may be used.

This embodiment employs the technique disclosed in Embodiment 1 of Japanese Patent Application Laid-open No. Hei 7-130652. The publication discloses a technique in which a very thin film containing a catalytic element is formed by spin coating on the entire surface of an amorphous silicon thin film to crystallize the amorphous silicon thin film utilizing the catalytic action.

The catalytic element that can be used is one or more kinds of elements selected from the group consisting of nickel (Ni), cobalt (Co), iron (Fe), palladium (Pd), platinum (Pt), copper (Cu), gold (Au), germanium (Ge), lead (Pb), and indium (In).

An SOI substrate may be used instead of forming a semiconductor thin film on the substrate 401 that has an insulating surface.

Next, a photo resist 403 shaped after a pattern for forming an active layer 404 is formed. The side ends of the photo resist 403 are tapered as shown in FIG. 4A. In order to shape the resist as this, normal resist application is followed by exposure with the focus of the exposure device shifted from the normal position by 1 to 2 μm and then the resist is developed. Alternatively, the surface of the photo resist 403 may be fused through baking treatment after normal exposure and development. In this embodiment, the taper angle of the side ends of the photo resist 403 is desirably 20 to 70°. This makes it easy to taper the active layer side ends in a later active layer forming step.

The polycrystalline silicon thin film 402 is then subjected to anisotropic etching using the photo resist 403 as a mask to form the active layer 404 as shown in FIG. 4B.

In the anisotropic etching, too large selective ratio of the polycrystalline silicon thin film 402 and photo resist 403 (the etching rate of the polycrystalline silicon film to the etching rate of the photo resist) is not desirable and the suitable selective ratio is 1/5 to 2. By keeping this selective ratio, the tapered shape of the photo resist 403 is reflected to taper the active layer side ends 405 through etching. In this embodiment, RIE apparatus is employed and a mixture of $CF_4$ and $O_2$ is used at a ratio of $CF_4:O_2=1:1$ in the anisotropic etching. By tapering the active layer side ends 405 as described, a uniform thermal oxide film can be formed on the entire surface of the active layer 404 in a later thermal oxidization step.

The taper angle of the active layer side ends 405 is desirably 20 to 70° (more desirably 30 to 60°). The tapered shape of the active layer side ends 405 can be controlled by adjusting exposure conditions and baking conditions of the photo resist 403. The shape can also be controlled by adjusting the selective ratio conditions of the polycrystalline silicon thin film 402 and photo resist 403 in the anisotropic etching step. These conditions are set to suit a desired taper angle.

The photo resist 403 is then removed. The next step is channel doping for shifting the threshold after completion of the manufacture of the memory TFT to the Normally Off side. In the channel doping, the active layer 404 is doped with a p type impurity element (boron, in this embodiment). The concentration of boron is adjusted to settle within a range between $1\times10^{17}$ atoms/cm$^3$ and $1\times10^{19}$ atoms/cm$^3$. If the TFT to be manufactured is a p type memory TFT, the active layer is doped with an n type impurity element, although channel doping is not particularly necessary in this case.

Next, a photo resist shaped after a pattern for forming an overlap region is formed on the active layer 404 though not shown in the drawings. This photo resist is used as a mask in doping of an impurity element that gives one conductivity type. The impurity element employed in the doping is a p type impurity element (phosphorus, in this embodiment.) The concentration of phosphorus is adjusted to settle within a range between $1\times10^{19}$ atoms/cm$^3$ and $1\times10^{22}$ atoms/cm$^3$.

In the manufacture of the n type memory TFT of this embodiment, the overlap region is provided in order to improve efficiency in injecting hot electrons to the floating gate and to present a withdrawal region when electric charges are withdrawn. The amount of impurity element in the doping is determined so as to suit the purposes.

After the impurity element doping step is completed as described above, the impurity elements are activated by one of furnace annealing, laser annealing, and lamp annealing, or by a combination of these annealing methods. At the same time, the damage the active layer has received during the doping step is repaired. In this embodiment, heat treatment is conducted in a nitrogen atmosphere at 800° C. for an hour.

Next, as shown in FIG. 4C, a tunnel oxide film 406 is formed. The tunnel oxide film in this embodiment is a thermal oxide film with a thickness of 200 angstrom obtained by forming a 200 angstrom thick silicon dioxide film by reduced pressure CVD apparatus and then subjecting the film to thermal oxidization in an oxygen atmosphere. The tunnel oxide film 406 may be a single layer obtained by a thermal oxidization process, or a laminate of a thermal oxide film and an oxide film that contains silicon and is formed by CVD apparatus. The atmosphere for thermal oxidization may be an oxygen atmosphere or an oxidized atmosphere containing a halogen element.

In this embodiment, the active layer side ends 405 are tapered and therefore the tunnel oxide film 406 is uniform throughout the active layer including the active layer side end corners 407.

As shown in FIG. 4D, a conductive thin film 408 is formed and a photo resist 409 shaped after a pattern for forming a floating gate 410 is formed. Using the photo resist 409 as a mask, anisotropic etching is performed on the conductive thin film 408 to form the floating gate 410. The conductive thin film 408 here may be a conductive polycrystalline silicon thin film, a tungsten thin film, an aluminum thin film, a thin film of a metal mainly containing aluminum, or a laminate of the above thin films. A tungsten thin film is used in this embodiment.

A second insulating film 411 is formed next as shown in FIG. 4E. The second insulating film 411 may be a silicon dioxide thin film or a laminate usually called an ONO film in which a silicon dioxide film, a silicon nitride film, and another silicon dioxide film are layered in order. This embodiment employs a silicon dioxide thin film with a thickness of 700 angstrom.

Formation of a conductive thin film, formation of a photo resist shaped after a pattern for forming a control gate 412, and etching of the conductive thin film using the photo resist as a mask are sequentially carried out to form the control gate 412. The conductive thin film here may be a conductive polycrystalline silicon thin film, a tungsten thin film, an aluminum thin film, a thin film of a metal mainly containing aluminum, or a laminate of the above thin films. A tungsten thin film is used in this embodiment.

The subsequent steps are not shown in the drawings. An interlayer insulating film, a metal wiring line contact hole, and a metal wiring line layer are formed to complete the n type memory TFT according to Embodiment 1 of the present invention.

By using the above non-volatile memory manufacturing method of the present invention, thinning of the tunnel oxide film at semiconductor side end corners of the memory transistor can be avoided as well as electric field concentration. Therefore a leak current from the floating gate to the active layer can be reduced. The electric charge holding characteristic can also be improved. Furthermore, the method is capable of making the insulating film even thinner while keeping the electric charge holding characteristic and achieves lower voltage operation, quicker rewriting, and less power consumption.

Embodiment 2

This embodiment describes a method of manufacturing a non-volatile memory in which active layer side ends are tapered and tiered to have two or more tiers.

The manufacturing steps of Embodiment 1 are employed here for steps from formation of a semiconductor thin film on a substrate having an insulating surface through formation of a photo resist having an active layer pattern. In the subsequent step of etching the semiconductor thin film, active layer side ends are tapered to have two tiers. The taper angle of the active layer side ends is set such that the upper tier has a smaller taper angle (preferably 20 to 50°) and the lower tier has a larger taper angle (preferably 40 to 70°). This prevents the active layer side ends from being pointed at the interface between the substrate having an insulating surface and the active layer.

The active layer side ends can be tapered to have two tiers by changing the selective ratio of the semiconductor thin film and photo resist from one in the former half of the semiconductor thin film etching step to the other in the latter half of the etching step. At this point, the selective ratio of the semiconductor thin film and photo resist in the latter half of the etching step is set smaller than the selective ratio of the semiconductor thin film and photo resist in the former half of the etching step to make the taper angle of the upper tier of the active layer side ends smaller than the taper angle of the lower tier. Specifically, when RIE apparatus is used for anisotropic etching in a $CF_4+O_2$ gas atmosphere, for example, the ratio of $O_2$ gas flow rate is increased in the latter half of the etching step.

When the active layer side ends are tapered and tiered to have two tiers with the upper tier having a smaller taper angle and the lower tier having a larger taper angle as described above, it is easy to form a tunnel oxide film of uniform thickness and electric field concentration hardly takes place.

If the selective ratio condition of the semiconductor thin film and photo resist is changed three times or more, or is continuously changed, in the semiconductor thin film etching step, the active layer side ends can be tapered and tiered to have three tiers or more, or can be continuously tapered.

The active layer side ends can be tapered with three or more tiers, or can be continuously tapered, by changing the selective ratio of the semiconductor thin film and photo resist at a multitude of stages, or by continuously changing the selective ratio, during the etching step so that the selective ratio is progressively reduced. Specifically, when RIE apparatus is used for anisotropic etching in a $CF_4+O_2$ gas atmosphere, for example, the ratio of $O_2$ gas flow rate is increased at a multitude of stages, or is continuously increased.

In the active layer side ends with three or more tiers, or in the active layer side ends continuously tapered, the taper angle is set such that the topmost tier, or the highest point of the slope, has the smallest taper angle (preferably 20 to 40°) and the lower tiers, or lower points of the slope, have progressively larger taper angles to give the bottom most tier, or the lowest point of the slope, the largest taper angle (preferably 50 to 70°). This prevents the active layer side ends from being pointed at the interface between the substrate having an insulating surface and the active layer.

Subsequent to the semiconductor thin film etching step, a tunnel oxide film, a floating gate, a second insulating film, a control gate, source and drain regions, an interlayer insulating film, a metal wiring line contact hole, and a metal wiring line layer are formed to complete the memory TFT of the present invention. The tunnel oxide film and other components can be formed by the process shown in Embodiment 1.

By using the above non-volatile memory manufacturing method of the present invention, thinning of the tunnel oxide film at semiconductor side end corners of the memory transistor can be avoided as well as electric field concentration. Therefore a leak current from the floating gate to the active layer can be reduced. The electric charge holding characteristic can also be improved. Furthermore, the method is capable of making the insulating film even thinner while keeping the electric charge holding characteristic and achieves lower voltage operation, quicker rewriting, and less power consumption.

Embodiment 3

A memory TFT of the present invention can be applied to any known circuit structure that uses a non-volatile memory element. This embodiment describes a case of applying the present invention to a NOR flash memory.

Figure 5A:
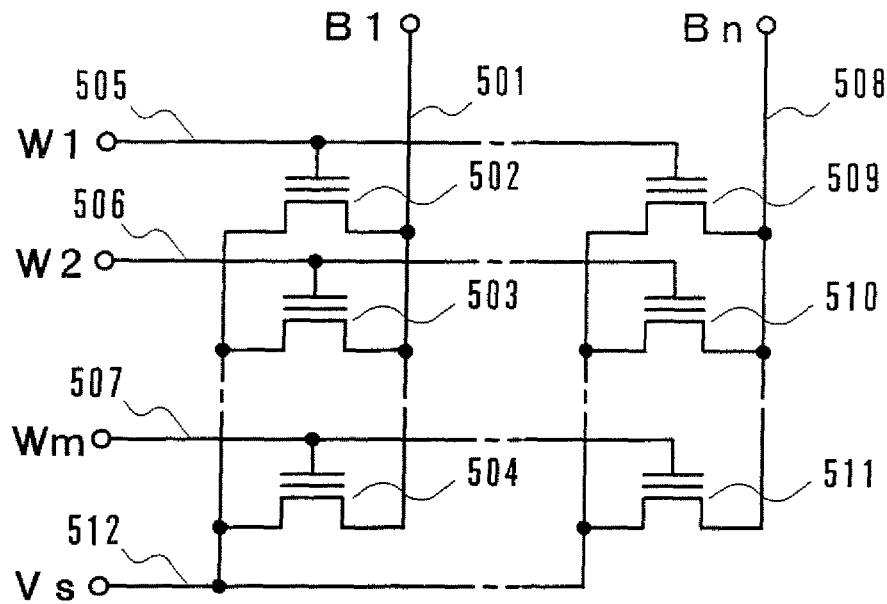
FIG. 5A is a diagram showing circuits of a NOR flash memory using a memory TFT of the present invention.

FIG. 5A is a circuit diagram of a NOR flash memory circuit in which memory TFTs are arranged so as to form a matrix having m rows and n columns (m and n are integers each equal to or larger than 1). The conductivity type of the memory TFTs is either n type or p type.

In FIG. 5A, m memory TFTs 502 to 504 in the first column are connected to a bit line 501 indicated by B1. The in memory TFTs 502 to 504 respectively use as control gates m word lines 505 to 507 indicated by W1 to Wm. Similarly, m memory TFTs 509 to 511 in the n-th column are connected to a bit line 508 indicated by Bn. The m memory TFTs 509 to 511 respectively use as control gates the m word lines 506 to 507. In the memory TFTs 502 to 504 and 509 to 511, the terminals that are not connected to the bit line 501 or 508 are connected to a source line 512 indicated by Vs.

Figure 5B:
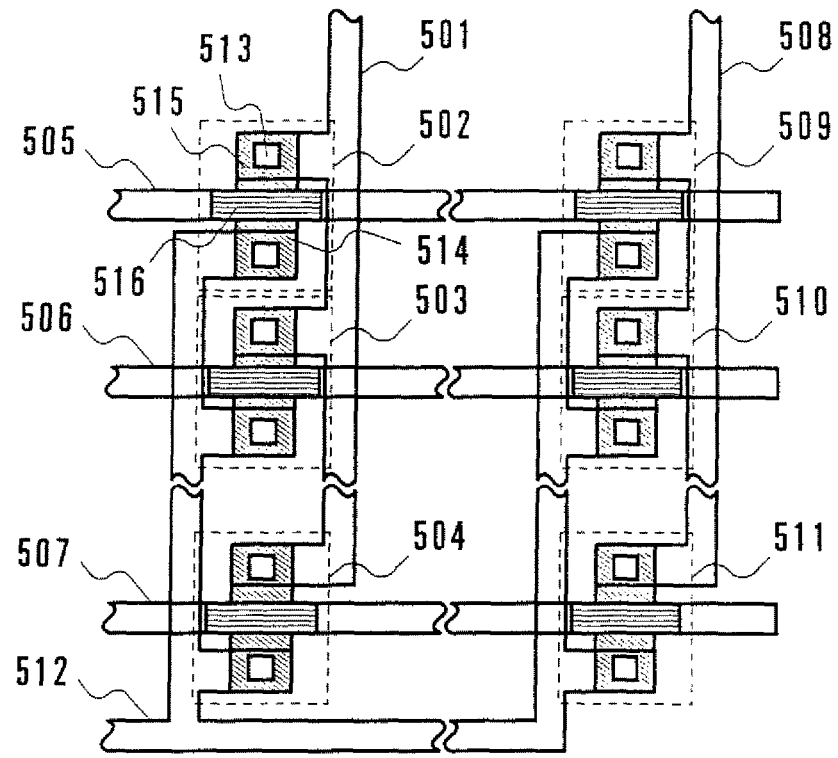
FIG. 5B is a top view of the flash memory of FIG. 5A.

FIG. 5B shows an example of top view of a memory cell array that constitutes the NOR flash memory circuit of FIG. 5A. In FIG. 5B, components corresponding to those in FIG. 5A are denoted by the same reference symbols.

In FIG. 5B, contact holes 513 electrically connect the source region 514 to the source line 512 and a drain region 515 to the bit line 501. Denoted by 516 is a floating gate.

An operation method of the NOR flash memory composed of the memory TFTs of the present invention is described. Although the description here deals with a circuit constituted of n type memory TFTs, the operation method is also applicable to a circuit constituted of p type memory TFTs by changing the applied voltage suitably. Data are written by hot electrons and erased by a tunnel current between the floating gate and the active layer. Writing in this description is bit-by-bit writing and erasure here is batch erasure.

In this embodiment, a "1" state means a state in which electric charges are accumulated in a floating gate of a memory TFT and the threshold voltage in this state is 6 V or more. A "0" state means a state in which electric charges are not accumulated in a floating gate of a memory TFT and the threshold voltage in this state is 0.5 to 3 V.

Bit-by-bit writing is described first. A case of writing a "1" signal in the memory TFT 502 of FIGS. 5A and 5B is described as a specific example.

First, the source signal line 512 is connected to GND. Then a positive electric potential (8 V, for example) is applied to the bit line 501 and a positive electric potential (12 V, for example) is applied to the word line 505. The other bit lines and word Lines ((n−1 bit) lines and (m−1) word lines, respectively) are connected to the GND.

As a result, hot electrons are generated in the vicinity of the drain region of the memory TFT 502 and electric charges are injected to the floating gate by the electric field between the floating gate and active layer to write a "1" signal. No electric charges are injected to the other (m×n−1) memory TFTs.

In the case of batch erasure, first, the source line 512 is connected to GND. Then the m word lines 505 to 507 are connected to a negative electric potential (−20 V, for example). The n word lines 505 to 507 are set to a floating state. As a result, a tunnel current flows from the floating gate to the source region in each of the m×n memory TFTs 502 to 504 and 509 to 511 and the "0" state is reached.

The description given next is about reading. A method of reading information of the memory TFT 502 in FIGS. 5A and 5B is described as a specific example. First, the source line 512 is connected to GND. Then all the word lines except the word line 505, namely, the (m−1) word lines 506 and 507, are connected the GND. This turns all the memory TFTs but the n memory TFTs 502 and 509 that are connected to the word line 505 OFF. In other words, n×(m−1) memory TFTs 503, 504, 510, and 511 are turned OFF. In this state, 5 V is applied to the word line 505 to apply a minute positive electric potential (1 V, for example) to the bit line 501. When the memory TFT 502 is in the "1" state, the memory TFT 502 is turned OFF and no current flows between the source and the drain. On the other hand, when the memory TFT 502 is in the "0" state, the memory TFT 502 is turned ON and a current flows between the source and the drain. Information of the memory TFT 502 is read by detecting the source-drain current.

The circuit structure of this embodiment can be obtained by the manufacturing process shown in Embodiment 1 or 2.

Embodiment 4

This embodiment describes a case of applying a memory TFT of the present invention to a NAND flash memory.

Figure 6A:
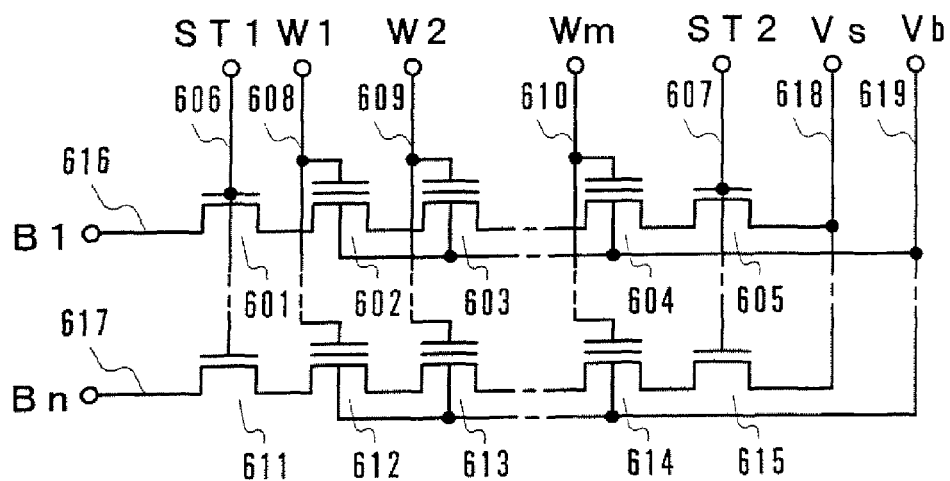
FIG. 6A is a diagram showing circuits of a NAND flash memory using a memory TFT of the present invention.

FIG. 6A is a circuit diagram of a NAND flash memory circuit having n (n is an integer equal to or larger than 1) columns of TFTs with each column being composed of serially-connected m (m is an integer equal to or larger than 1) memory TFTs and two TFTs. The conductivity of the memory TFTs and other TFTs may either be n type or p type.

In FIG. 6A, a selecting TFT 601, m memory TFTs 602 to 604, and a selecting TFT 605 are connected in series in the first column. The selecting TFTs 601 and 605 use as control gates selecting lines 606 and 607 indicated by ST1 and ST2, respectively. The m memory TFTs 602 to 604 respectively use as control gates m word lines 608 to 610 indicated by W1 to Wm. Similarly, a selecting TFT 611, m memory TFTs 612 to 614, and a selecting TFT 615 are connected in series in the n-th column. The selecting TFTs 611 and 615 use as control gates the selecting lines 606 and 607, respectively. The m memory TFTs 612 to 614 respectively use as control gates the m word lines 608 to 610. In the selecting TFTs 601 and 611, the terminals that are not connected to the memory TFTs are connected to bit lines 616 and 617 indicated by B1 and Bn, respectively. In the selecting TFTs 605 and 615, the terminals that are not connected to the memory TFTs are connected to a source line 618 indicated by Vs. A channel forming region is electrically connected to a body line 619 in each of the memory TFTs 602 to 604 and 612 to 614.

Figure 6B:
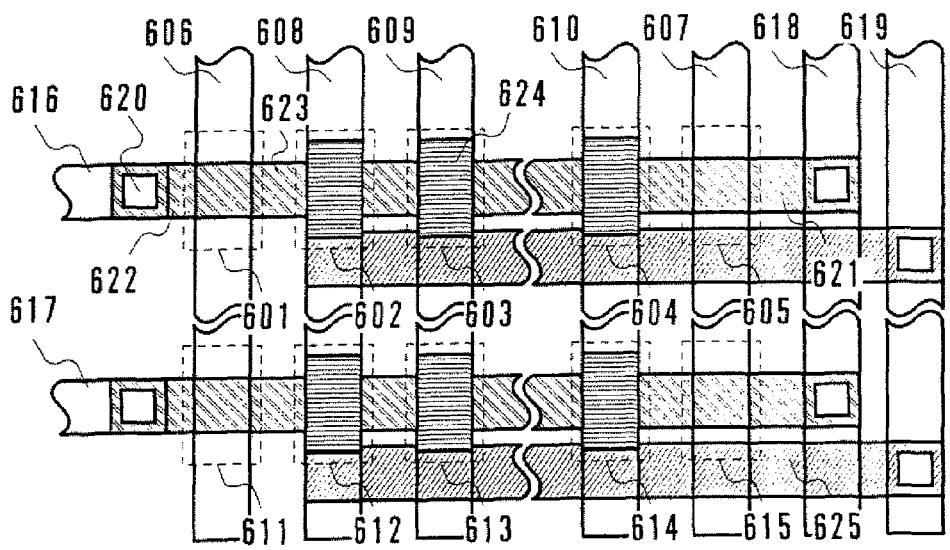
FIG. 6B is a top view of the flash memory of FIG. 6A.

FIG. 6B shows an example of top view of a memory cell array that constitutes the NAND flash memory circuit of FIG. 6A. In FIG. 6B, components corresponding to those in FIG. 6A are denoted by the same reference symbols.

Contact holes 620 connect a source region 621 to the source line 618 and a drain region 622 to the bit line 616. Denoted by 623 is a source/drain region and 624 denotes a floating gate. A body terminal 625 is formed by doping the semiconductor thin film with an impurity that has the conductivity opposite to the polarity of the source region 621 and drain region 622.

An operation method of the thus structured memory TFTs of the present invention is described. Although the description here deals with a circuit constituted of n type memory TFTs and TFTs, the operation method is also applicable to a circuit constituted of p type memory TFTs and TFTs by changing the applied voltage suitably. In this embodiment, data are written and erased by a tunnel current between the floating gate and the active layer. Writing in this description is line-by-line writing and erasure here is batch erasure.

In this embodiment, a "1" state means a state in which electric charges are accumulated in a floating gate of a memory TFT and the threshold voltage in this state is 6 to 8 V. A "0" state means a state in which electric charges are not accumulated in a floating gate of a memory TFT and the threshold voltage in this state is 2 V or less.

Line-by-line writing is described first. Described as a specific example is a case in which a "1" signal is written in only the memory TFT 602 out of the n memory TFTs connected to the word line 608 in FIGS. 6A and 6B whereas "0" signal is written in the rest of them, namely, the (n−1) memory TFTs 612. Before writing, all of the memory TFTs are in the "0" state.

First, the source signal line 618 is connected to GND. Then the bit line 616 is dropped to GND to apply a positive electric potential (10 V, for example) to the (n−1) bit lines 617. A positive electric potential (12 V, for example) is applied to the selecting line 606 to turn the n selecting TFTs 601 and 611 ON. The selecting line 607 is connected to the GND to turn the n selecting TFTs 605 and 615 OFF. Next, a positive electric potential (20 V, for example) is applied to the word line 608 and a positive electric potential (10 V, for example) is applied to the other word lines, namely, the (m−1) word lines 609 and 610.

As a result, a high voltage of about 20 V is applied between the control gate and the active layer in the memory TFT 602 out of the n memory TFTs connected to the word line 608, and a tunnel current is caused to flow by the electric field between the floating gate and the active layer to inject electric charges to the floating gate. Thus the "1" state is reached. On the other hand, in the rest of the memory TFTs connected to the word line 608, namely, the (n−1) memory TFTs 612, a voltage as high as 10 V at most is applied between the control gate and the active layer. The voltage is not high enough to cause a tunnel current to flow between the floating gate and the active layer and no electric charges are injected to the floating gate. Therefore the "0" state is maintained.

In the n×(m−1) memory TFTs connected to the (m−1) word lines 609 and 610, which are all of the word lines except the word line 608, a voltage as high as 10 V at most is applied to the control gate-active layer. The voltage is not high enough to cause a tunnel current to flow between the floating gate and active layer and no electric charges are injected to the floating gate. Therefore the "0", state is maintained.

In the case of batch erasure, first, the body line 619 is connected to GND. Then the source line 618 and all of the n bit lines 616 and 617 are set to a floating state. The 2×n selecting TFTs 601, 605, 611, and 615 may either be ON or OFF. A negative electric potential (−20 V, for example) is then applied to all of the m word lines 608 to 610. As a result, a high voltage of about 20 V is applied between the control gate and the active layer and a tunnel current flows from the floating gate to the source region in each of the m×n memory TFTs 608 to 610 and 612 to 614. Thus the "0" state is reached in all of the m×n memory TFTs 608 to 610 and 612 to 614.

The description given next is about reading. A method of reading information of the memory TFT 602 in FIGS. 6A and 6B is described as a specific example. First, the source line 618 is connected to GND. A positive electric potential (3 V, for example) is applied to the selecting lines 606 and 607 to turn all the 2n selecting TFTs 601, 605, 611, and 615 ON. Then a positive electric potential (8 V, for example) is applied to all the word lines except the word line 608, namely, the (m−1) word lines 609 and 610 to turn ON all the n×(m−1) memory TFTs 603, 604, 613, and 614 that are connected to the (m−1) word lines 609 and 610. In this state, 4 V is applied to the word line 608 to apply a minute positive electric potential (1 V, for example) to the bit line 616. When the memory TFT 602 is in the "1" state, the memory TFT 602 is turned OFF and no current flows between the source and the drain. On the other hand, when the memory TFT 602 is in the "0" state, the memory TFT 602 is turned ON and a current flows between the source and the drain. In this way, information of the memory TFT 602 is read by detecting the source-drain current.

In a NOR circuit as the one shown in Embodiment 3, each memory TFT is connected directly to a bit line and a source line. Therefore the circuit is advantageous in that injection of electrons to a floating gate can be made accurate and precise reading can be executed. Moreover, reading time in this circuit is shorter than in the NAND circuit of this embodiment.

Although the NAND circuit of this embodiment is slower in reading than the NOR circuit of Embodiment 3, the NAND circuit is advantageous in that the degree of integration is greatly improved.

The circuit structure of this embodiment can be obtained by the manufacturing process shown in Embodiment 1 or 2.

Embodiment 5

This embodiment describes a case of applying a memory TFT of the present invention to a microprocessor integrated on an SOI substrate.

Figure 7:
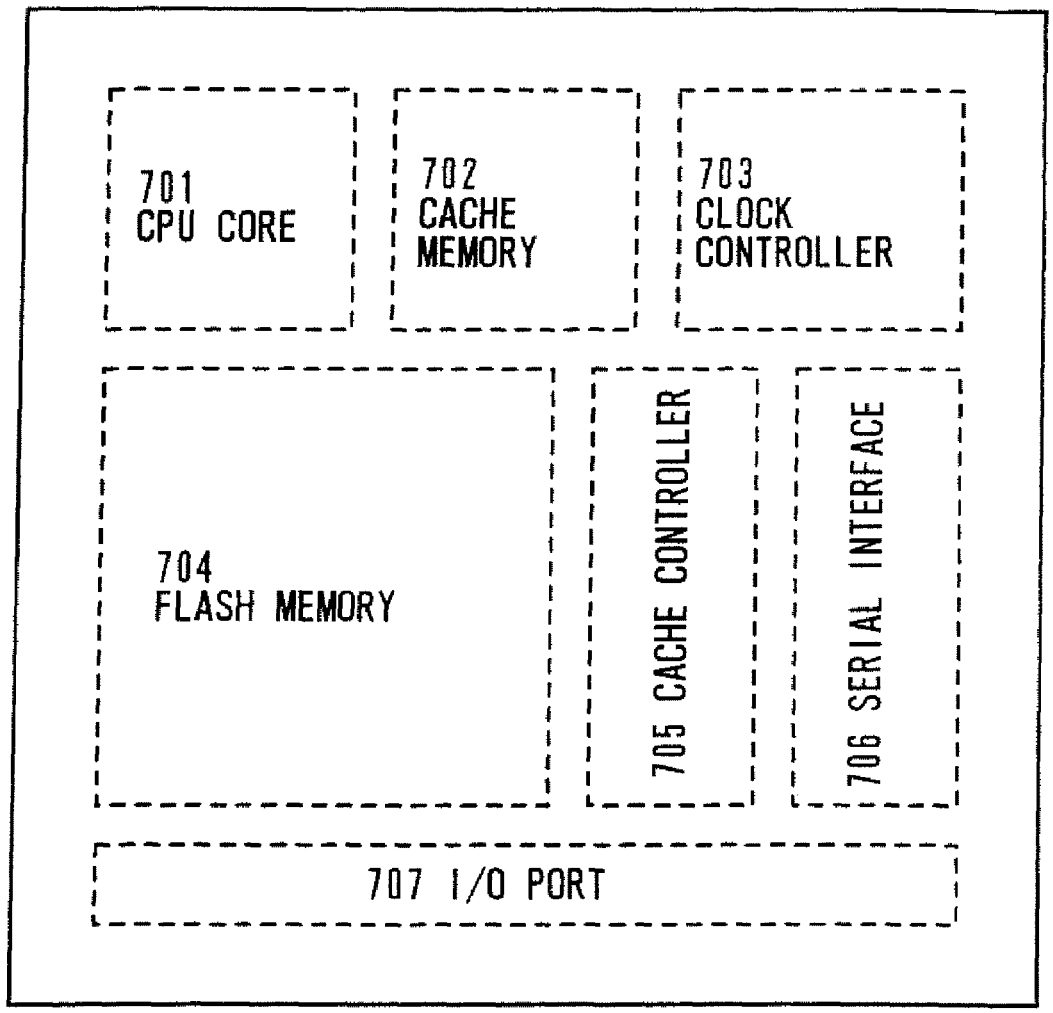
FIG. 7 is a diagram showing a semiconductor circuit that uses a memory TFT of the present invention.

Shown in FIG. 7 is an example of the microprocessor. The microprocessor is typically composed of a CPU core, a flash memory, a RAM, a clock controller, a cache memory, a cache controller, a serial interface, an I/O port, etc. The microprocessor shown in FIG. 7 is a simplified example, of course, and an actual microprocessor can have various circuit designs to suit its use.

In the microprocessor shown in FIG. 7, a CPU core 701, a cache memory 702, a clock controller 703, a cache controller 705, a serial interface 706, and an I/O port 707 are build from CMOS circuits. A memory TFT of the present invention is used in a flash memory 704. The flash memory can have the NOR circuit structure shown in Embodiment 3, the NAND circuit structure shown in Embodiment 4, or any other known circuit structures. The microprocessor of this embodiment can be manufactured by the manufacturing process of Embodiment 1 or 2.

Embodiment 6

The memory TFT of the invention is enabled to provide a small-sized semiconductor device having multiple high functions by forming it integrally with the parts of a semiconductor device which is constructed of TFTs formed over a substrate having an insulating surface. In this embodiment, the semiconductor device is exemplified by an electro-optic device (as represented by a liquid crystal display device and an EL display device), which is provided with a memory TFT of the invention, a pixel portion, a driver circuit for the pixel portion, and a γ (gamma) correction circuit.

The γ-correction circuit is a circuit for the γ-correction. This is a correction for establishing a linear relation between a voltage applied to a pixel electrode and an optical transmission intensity of an overlying liquid crystal or EL layer by adding a proper voltage to an image signal.

Figure 8:
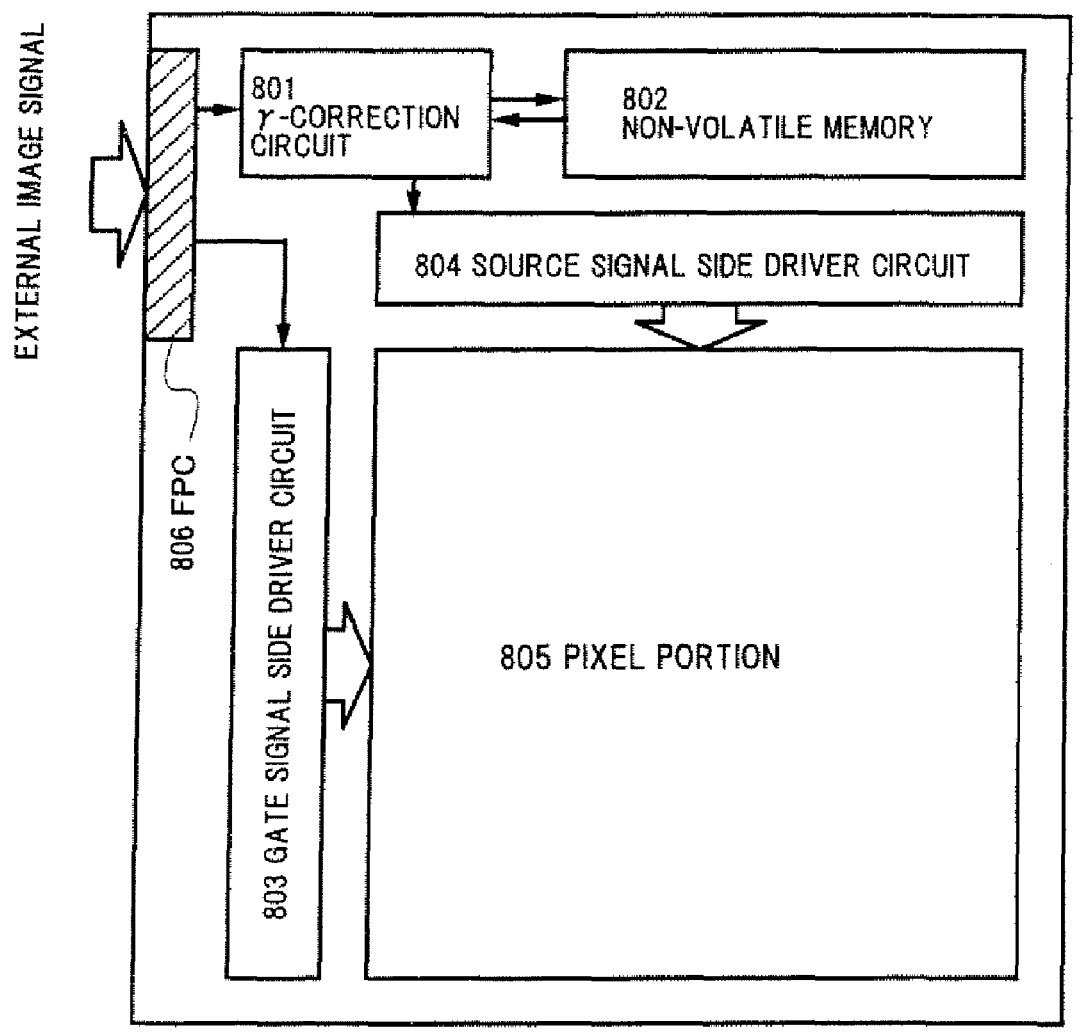
FIG. 8 is a diagram showing an electrooptical device that uses a memory TFT of the present invention.

FIG. 8 is a block diagram of the aforementioned electro-optic device. This electro-optic device is provided with: a memory TFT of the invention; a pixel portion 805; a gate signal side driver circuit 803 and a source signal side driver circuit 804 for driving the pixel portion; and a γ (gamma) correction circuit 801. On the other hand, an image signal, a clock signal or a synchronizing signal is transmitted via an FPC (Flexible Print Circuit) 806. The non-volatile memory 802 may use the circuit structure shown in Embodiment 3 or 4.

On the other hand, the electro-optic device of this embodiment can be integrally formed over the substrate having the insulating surface by the manufacture method of Embodiment 1 or 2, for example. Here, the step after the formation of the TFTs including the formation of the liquid crystal or the EL layer may be exemplified by the well-known method.

On the other hand, the pixel portion 805, the driver circuits 803 and 804 of the pixel portion, and the γ (gamma) correction circuit 801 may be exemplified by the well-known circuit structures.

In the electro-optic device of this embodiment, the non-volatile memory 802 has stored (or memorized) the correction data for γ-correcting the image signal transmitted from the personal computer body or the TV receiving antenna or the like. The γ-correction circuit 1101 γ-corrects the image signal with reference to the correction data.

The data for the γ-correction may be once stored before shipped to the electro-optic device, but the correction data could be periodically rewritten. Even between the electro-optic devices manufactured likewise, on the other hand, the optical response characteristics (e.g., the aforementioned relation between the optical transmission intensity and the applied voltage) of the liquid crystal may be delicately different. In this case, too, γ-correction data different for the individual electro-optic devices can be stored so that an identical image quality can always be obtained.

By storing the non-volatile memory with a plurality of correction data and by adding a new control circuit, moreover, it is possible to select a plurality of color tones freely based on the correction data.

Here, when the correction data for the γ-correction are to be stored in the non-volatile memory 802, it is preferred to use the means disclosed in Japanese Patent Laid-Open No. 10-156696 of the same Applicant. This Laid-Open has also described the γ-correction.

Since the correction data to be stored in the non-volatile memory are digital signals, on the other hand, it is desired to form a D/A converter or an A/D converter, if necessary, over the common substrate.

Embodiment 7

An example of the semiconductor device, which is equipped with the non-volatile memory structured by the memory TFT of the present invention but different from that disclosed in Embodiment 5, will be described with reference to FIG. 9.

Figure 9:
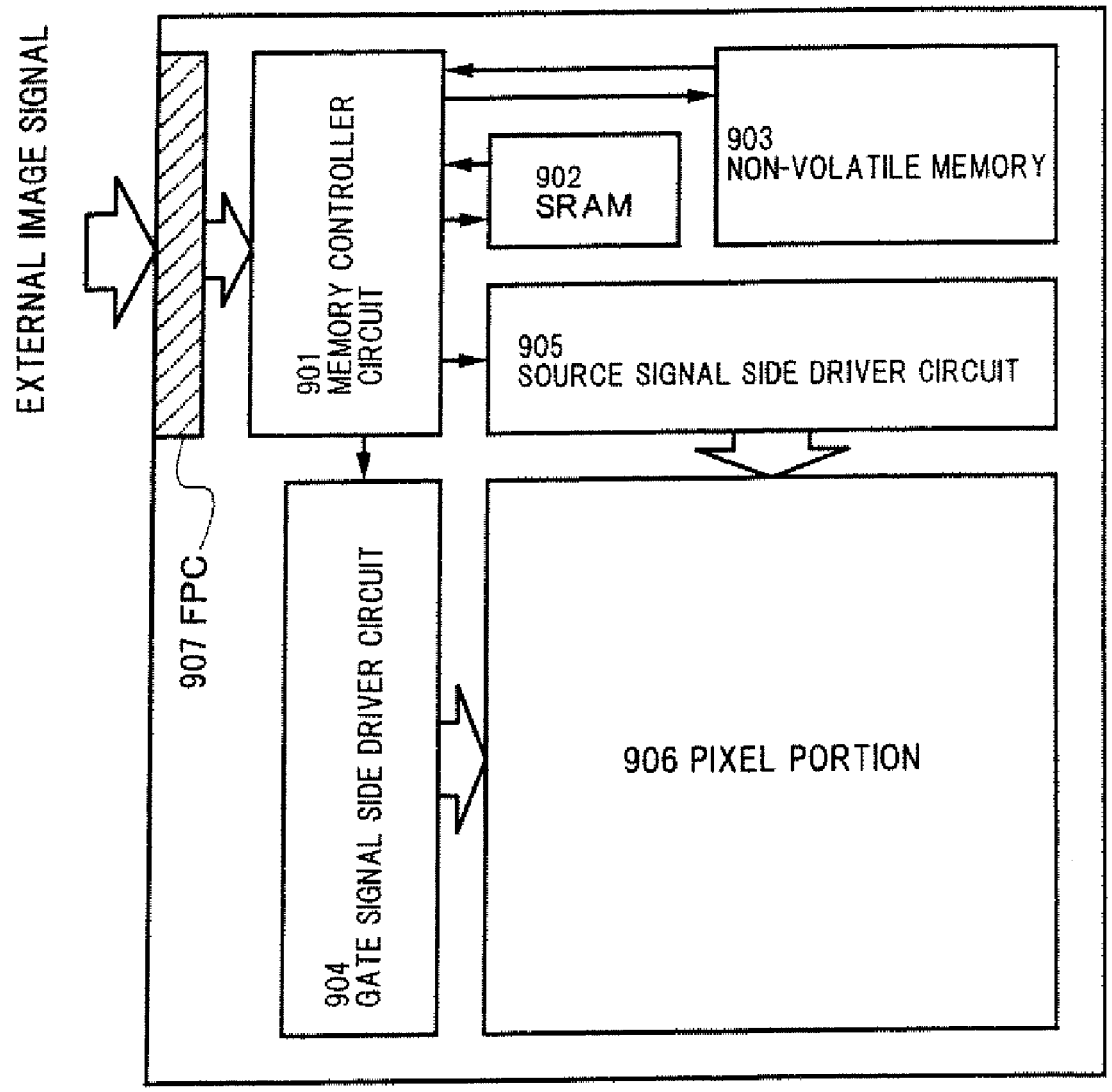
FIG. 9 is a diagram showing an electrooptical device that uses a memory TFT of the present invention.

FIG. 9 is a block diagram showing an electro-optic device (as represented by a liquid crystal display device and an EL display device) of this embodiment. This electro-optic device of the embodiment is provided with a non-volatile memory 903 of the invention; a SRAM 902; a pixel portion 906; a gate signal side driver circuit 904 and a source signal side driver circuit 905 for driving circuit of the pixel portion; and a memory controller circuit 901. On the other hand, an image signal, a clock signal or a synchronizing signal is transmitted via an FPC (Flexible Print Circuit) 907.

The memory controller circuit 901 in this embodiment is a control circuit for controlling the operations to store and read the image data in and from the SRAM 902 and the non-volatile memory 903.

The SRAM 902 is provided for writing data at a high speed. This SRAM may be replaced by a DRAM and may also be omitted if the non-volatile memory can write at a high speed. The non-volatile memory 902 may use the circuit structure shown in Embodiment 3 or 4.

The electro-optic device of this embodiment can be integrally formed over the substrate having the insulating surface, for example, by the manufacture method of Embodiment 1 or 2. Here, the step after the formation of the TFTs including the formation of the liquid crystal or the EL layer may be exemplified by the well-known method.

On the other hand, the SRAM 902, the pixel portion 906, the driver circuits of the pixel portion 904, 905 and the memory controller circuit 901 may use the well-known circuit structures.

In the electro-optic device of this embodiment, the image signals, as transmitted from the personal computer body or the TV receiving antenna, are stored (or memorized) for each frame in the SRAM 902 and are sequentially inputted to and displayed in the pixel portion 906 by the memory controller circuit 901. The SRAM 902 is stored with at least the image information of one image frame to be displayed in the pixel portion 906. Where digital signals of 6 bits are transmitted as the image signals, for example, there is required a memory capacity corresponding to at least the pixel number×6 bits. By the memory controller circuit 901, on the other hand, it is possible, if necessary, to store the image signals in the non-volatile memory 903 from the SRAM 902 and to input and display the image signals from the non-volatile memory 903 to and in the pixel portion 906.

Since the image data to be stored in the SRAM 902 and the non-volatile memory 903 are digital signals, on the other hand, it is desired to form a D/A converter or an A/D converter, if necessary, over the common substrate.

In the construction of this embodiment, the image displayed in the pixel portion 906 is always stored in the SRAM 902 so that it can be easily paused. By storing the image signals from the SRAM in the non-volatile memory 903 and by inputting the image signals in the non-volatile memory 903 to the pixel portion, moreover, the operations to record and reproduce the image can be easily performed. Still moreover, the TV broadcasting can be freely paused, recorded and reproduced without being recorded in the video deck or the like.

The information volume of the image to be recorded and reproduced depends upon the storage capacities of the SRAM 902 and the non-volatile memory 903. A still image can be recorded and reproduced by storing the image signals of at least one frame. If the storage capacity of the non-volatile memory 903 can be increased to such an extent as to store the image information of several hundreds or thousands of frames, moreover, it is possible to reproduce (or replay) the image before several seconds or minutes.

As described in detail in the above, the present invention is capable of avoiding thinning of a tunnel oxide film as well as electric field concentration at active layer side end corners.

Therefore, the present invention can reduce a leak current from a floating gate to an active layer and therefore can enhance the electric charge holding characteristic. Furthermore, the present invention is capable of making an insulating film even thinner while keeping the electric charge holding characteristic to achieve lower voltage operation, quicker rewriting, and less power consumption.

What is claimed is:

1. A manufacturing method for a semiconductor device including a non-volatile memory, comprising the steps of:
   forming a semiconductor film on an insulating surface;
   forming a resist pattern over the semiconductor film;
   etching the semiconductor film to form a semiconductor island having tapered side edges by decreasing a selective ratio of the semiconductor film and the resist pattern;
   forming a first insulating film on the semiconductor island;
   forming a floating gate film over a channel forming region of the semiconductor island with the first insulating film interposed therebetween, the floating gate film covering the tapered side edges of the semiconductor island;
   forming a second insulating film over the floating gate film; and
   forming a control gate film over the floating gate film with the second insulating film interposed therebetween, the control gate film covering the tapered side edges of the semiconductor island.

2. The manufacturing method according to claim 1, wherein the forming the first insulating film is conducted by thermal oxidation of the semiconductor island.

3. The manufacturing method according to claim 1, wherein the forming the first insulating film is conducted by a chemical vapor deposition.

4. The manufacturing method according to claim 1, wherein the selective ratio is decreased continuously during etching.

5. The manufacturing method according to claim 1, wherein $CF_4$ gas and $O_2$ gas are used, and a ratio of the $O_2$ gas is increased continuously during etching.

6. A manufacturing method for an electro-optic device including a non-volatile memory, comprising the steps of:
   forming a semiconductor film on an insulating surface;
   forming a resist pattern over the semiconductor film;
   etching the semiconductor film to form a semiconductor island having tapered side edges by decreasing a selective ratio of the semiconductor film and the resist pattern;
   forming a first insulating film on the semiconductor island;
   forming a floating gate film over a channel forming region of the semiconductor island with the first insulating film interposed therebetween, the floating gate film covering the tapered side edges of the semiconductor island;
   forming a second insulating film over the floating gate film; and
   forming a control gate film over the floating gate film with the second insulating film interposed therebetween, the control gate film covering the tapered side edges of the semiconductor island.

7. The manufacturing method according to claim 6, wherein the forming the first insulating film is conducted by thermal oxidation of the semiconductor island.

8. The manufacturing method according to claim 6, wherein the forming the first insulating film is conducted by a chemical vapor deposition.

9. The manufacturing method according to claim 6, wherein the selective ratio is decreased continuously during etching.

10. The manufacturing method according to claim 6, wherein $CF_4$ gas and $O_2$ gas are used, and a ratio of the $O_2$ gas is increased continuously during etching.

11. A manufacturing method for a display device including a non-volatile memory, comprising the steps of:
    forming a semiconductor film on an insulating surface;
    forming a resist pattern over the semiconductor film;
    etching the semiconductor film to form a semiconductor island having tapered side edges by decreasing a selective ratio of the semiconductor film and the resist pattern;
    forming a first insulating film on the semiconductor island;
    forming a floating gate film over a channel forming region of the semiconductor island with the first insulating film interposed therebetween, the floating gate film covering the tapered side edges of the semiconductor island;
    forming a second insulating film over the floating gate film; and
    forming a control gate film over the floating gate film with the second insulating film interposed therebetween, the control gate film covering the tapered side edges of the semiconductor island.

12. The manufacturing method according to claim 11, wherein the forming the first insulating film is conducted by thermal oxidation of the semiconductor island.

13. The manufacturing method according to claim 11, wherein the forming the first insulating film is conducted by a chemical vapor deposition.

14. The manufacturing method according to claim 11, wherein the selective ratio is decreased continuously during etching.

15. The manufacturing method according to claim 11, wherein $CF_4$ gas and $O_2$ gas are used, and a ratio of the $O_2$ gas is increased continuously during etching.

* * * * *